United States Patent [19]
Grycewicz

[11] Patent Number: 5,920,430
[45] Date of Patent: Jul. 6, 1999

[54] LENSLESS JOINT TRANSFORM OPTICAL CORRELATOR FOR PRECISION INDUSTRIAL POSITIONING SYSTEMS

[75] Inventor: Thomas J. Grycewicz, Fremont, Calif.

[73] Assignee: The United States of America as represented by the Secretary of the Air Force, Washington, D.C.

[21] Appl. No.: 08/924,057

[22] Filed: Aug. 28, 1997

[51] Int. Cl.$^6$ .................................................. G02B 27/46
[52] U.S. Cl. .......................... 359/561; 359/565; 356/354; 250/550; 382/278
[58] Field of Search .................................... 359/559, 560, 359/561, 558, 577, 573, 29, 565; 250/550; 356/354; 382/278

[56] References Cited

U.S. PATENT DOCUMENTS

| | | | |
|---|---|---|---|
| 4,624,569 | 11/1986 | Kwon | 356/354 |
| 5,438,632 | 8/1995 | Horner | 382/278 |
| 5,528,702 | 6/1996 | Mitsuoka et al. | 382/211 |
| 5,544,252 | 8/1996 | Iwaki et al. | 359/561 |
| 5,815,598 | 9/1998 | Hara et al. | 382/211 |

OTHER PUBLICATIONS

A. M. Weber, et al., "Hologram Recording in DuPont's New Photopolymer Materials", Practical Holography IV, SPIE OE/Laser Conf. Proc., 1212–04, Los Angeles, CA, Jan. 1990.
S. A. Rao, et al., "Holographic Methods for the Fabrication of Various Types of Mirrors", Rev. Sci. Instrum., vol. 51, No. 6, pp. 810–813, Jun. 1980.
R. T. Ingwall, et al., "Hologram Recording with a New Photopolymer System", Optical Engineering, vol. 24, No. 5, pp. 808–811, Oct. 1985.

*Primary Examiner*—Cassandra Spyrou
*Assistant Examiner*—John Juba, Jr.
*Attorney, Agent, or Firm*—Robert L. Nathans

[57] ABSTRACT

A lensless joint transform correlator optically determines the relative position of two pinholes placed in parallel arms of a Mach-Zehnder interferometer. The Fraunhaufer diffraction patterns combine to form a joint power spectrum signal in the joint transform plane. Because of the interference of the two pinhole signals, an encoded lens comprising a Fresnel zone is formed in the joint Fraunhaufer diffraction pattern which is illuminated with a plane wave, and the output signal is taken in the focal plane of the Fresnel zone and magnifies the input pinhole displacement by a factor of ten, enhancing its use in precision positioning servo systems for mask alignment.

22 Claims, 2 Drawing Sheets

| ORDER | FOCAL LENGTH (METERS) | PEAK WIDTH (MICRONS) | DIFFRACTION LIMITED WIDTH (MICRONS) | EXPERIMENTAL PNR (dB) |
|---|---|---|---|---|
| 3 | 1.84 | 264 | 155 | 110 |
| 5 | 1.18 | 168 | 100 | 106 |
| 7 | 0.87 | 264 | 73 | 21.2 |
| 9 | 0.71 | 288 | 60 | 9.3 |
| 11 | 0.58 | 432 | 42 | 6.1 |

LENSLESS JOINT TRANSFORM OPTICAL CORRELATOR FOR PRECISION INDUSTRIAL POSITIONING SYSTEMS

STATEMENT OF GOVERNMENT INTEREST

The invention described herein may be manufactured by or for the Government for governmental purposes without the payment of any royalty thereon.

BACKGROUND OF THE MENTION

It is deemed desirable to employ Fourier transform correlation technology for very high resolution positioning and alignment of various components such as silicon wafers or mask components during the manufacturing process.

The lensless joint transform correlator (LJTC) of the present invention is a new device for optically determining the relative x-y position of two pinholes which can be positioning fiducials. Its operation is similar to the operation of the chirp-encoded and single-lens joint transform correlator of U.S. Pat. No. 5,648,872 issued to Thomas Grycewicz on Jul. 15, 1997 and incorporated by reference herein. As in all variants on the joint transform correlator (JTC), the LJTC is a two stage device. The first stage produces a joint image transform, which is captured by a camera or optically addressed spatial light modulator (OASLM) and retransmitted in a second stage to form the correlation peak. As with the single-lens joint transform correlator, the LJTC forms a Fresnel zone in the transform plane and is easily operated with a large magnification in the output plane. Through binarization of the transform plane and use of a third or fifth order focus of the Fresnel zone, very high output resolution can be achieved. In the LJTC the transform plane is formed by a Fraunhaufer diffraction pattern, and the output is formed by Fresnel diffraction. A limitation of the LJTC is that the inputs must be pinholes or their equivalents such as tiny mirrors, while the closely related single-lens JTC correlates arbitrary input images. However, this limitation is advantageously employed in the present invention to provide a simple displacement measuring system for producing a very clean output signal. For applications like industrial positioning systems, where a pinhole can serve as well as any other alignment mark, the LJTC has the potential to be used in a very fast, high accuracy position measurement system and thus is a good candidate for processes where fast precision alignment is of great importance, such as mask alignment in semiconductor manufacture.

SUMMARY OF A PREFERRED EMBODIMENT OF THE INVENTION

The lensless joint transform correlator of the invention optically determines the relative x-y position of two pinholes. The pinholes are placed in parallel arms of an interferometer. The output is in the Fraunhaufer diffraction region for laser light passing through the pinholes. The Fraunhaufer diffraction patterns of the two pinholes combine to form a joint power spectrum signal in the joint transform plane. Because of the interference of the two pinhole signals, a Fresnel zone pattern is formed in the joint Fraunhaufer diffraction pattern. This is captured and used as a Fresnel zone plate in a second stage, just as the joint power spectrum is in a joint transform correlator. The joint transform is illuminated with a plane wave, and the correlation output taken in the focal plane of the Fresnel zone plate. As with the single-lens joint transform correlator, the lensless joint transform correlator exhibits magnification between the input displacement and the output correlation peak displacement. By using the third or fifth order focus of the Fresnel zone plate, the output resolution can be improved by a factor of three or five in both the x and y dimensions. The output has very good peak-to-noise and position resolution. A peak to noise ratio of 106 dB with a resolution of 1.4 micron were observed experimentally when using the fifth order focus of the Fresnel zone plate.

BRIEF DESCRIPTION OF THE DRAWINGS

Other features and advantages of the invention will become more apparent upon study of the following detailed description, taken in conjunction with the drawings in which.

DETAILED DESCRIPTION OF A PREFERRED EMBODIMENT OF THE INVENTION

Figure 1:
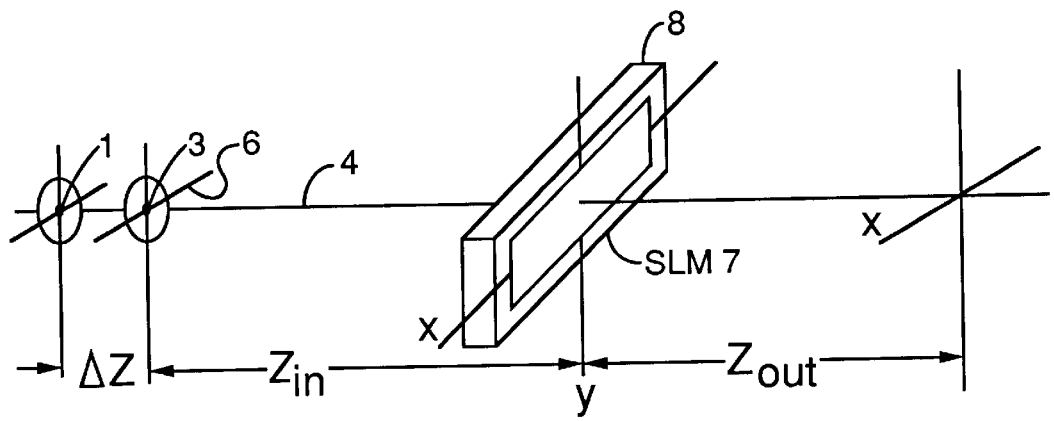
FIG. 1 schematically illustrates a principle of the invention.

Referring now to FIG. 1, the correlator inputs are pinholes 1 and 3 of diameter d, and are in input planes separated by a distance $\Delta z$ along optical axis 4. The distance from the scene input plane 6 to the transform plane 8 is $z_{in}$. The distance $Z_{in}$ must be long enough that OASLM or camera 7 in the transform plane is in the Fraunhaufer diffraction region for the pinholes. If the diameter of the pinholes is a few microns, this distance is a few centimeters. The reference pinhole 1 is placed on-axis, and the scene pinhole 3 is displaced from the optical axis 4 by a distance $(x_o, 0)$ in the x-y plane. In order to implement a practical system, the inputs can be configured in a Mach-Zehnder interferometer 9 as in the experimental setup shown in FIG. 2. This configuration allows input pinholes 1 and 3 to overlap the optical axis in the x-y dimensions. Here the displacement to be measured can be smaller than the pinhole diameter. The Fraunhaufer diffraction patterns from the two pinholes overlap and interfere in the transform plane at camera plane 7. The interference from the two pinholes forms a bulls eye or Fresnel zone pattern superimposed on the central lobe of the Airy disk formed by the pinhole's Fraunhaufer pattern. The scaling is chosen such that the central lobe of the Airy pattern illuminates an optically addresses spatial light modulator (OASLM) input or CCD camera 7 and several rings of the Fresnel zone plate are in the central lobe. The x-y location of the center of this zone plate will be displaced by an amount proportional to the x-y displacement of the inputs. Thus, at the joint transform plane, the joint power spectrum signal may be said to include an encoded lens signal. The output plane magnification at camera 11 is determined by the input plane separation ($\Delta z$), and can be quite large. The transform plane signal is captured by camera 7 and displayed on an SLM 13. When this display is illuminated with a plane wave produced by laser 15 via polarizer 17, the output focuses to a spot at the focal length of the zone plate via polarizer 17', forming the correlation output peak captured by CCD camera 11. This structure comprises the pinhole displacement output detector means.

Regarding input constraints, in order for the light passing through the pinholes 1 and 3 at the LJTC input to form a Fresnel zone plate in the transform plane at camera 7, constraints must be placed on the size of the pinholes and on their displacement in the x-y plane. The following three constraints will generally assure that a reasonable LJTC system is designed.

1. The active area of the transform plane camera or OASLM is evenly illuminated by the central lobe of the Airy pattern formed by the pinhole's Fraunhaufer diffraction pattern. When the central lobe of the pinhole output fills the transform plane, the Fraunhaufeer approximation be valid. If the pinhole diameter (d) is chosen such that the half power radius of the Airy pattern is greater than the transform plane radius (r), the requirement on the pinhole diameter is indicated by $$d \leq 0.129 \frac{\lambda z_{in}}{r}, \tag{1}$$

equation (1),
where $z_{in}$ is the distance from the input plane to the transform plane, and $\lambda$ is the wavelength of the input illumination.

2. The central lobes of the two Airy patterns must overlap in the transform plane, and the center of the Fresnel zone plate must be located in the region captured by the transform plane camera or OASLM.

3. The magnification must be chosen such that the zone plate has a reasonable focal length. If the separation distance ($\Delta z$) along optical axis 4 is small, the magnification is large, the focal length of the zone plate is long, and only a few fringes of the Fresnel zone are seen in the useful region of the transform plane. If the separation distance is large, the magnification is small, the focal length is short, and the zone plate's fringe spacing is so close that the SLM is resolution limited and can only display the center of the pattern.

The transform plane signal is the intensity of the sum of the Fraunhaufer diffraction recognized as an amplitude encoded Fresnel zone plate. This zone plate has a primary focal $$f_o = z_{in}\left(\frac{z_{in}}{\Delta z} + 1\right). \tag{3}$$

length given by equation (3).

$$x_o = \left(\frac{z_{in}}{\Delta z} + 1\right)x_o. \tag{4}$$

The center of this zone plate is located on the x axis as indicated by equation (4).

$$M = \left(\frac{z_{in}}{\Delta z} + 1\right). \tag{5}$$

Thus, the output magnification is indicated by equation (5).

The magnification is always greater than one, and can be quite large. Comparing Eq. 3 and Eq. 5 shows that the zone plate focal length and the magnification are proportional. Thus a large magnification is linked to a long focal length and also a large size for the Fresnel zone pattern.

Figure 2:
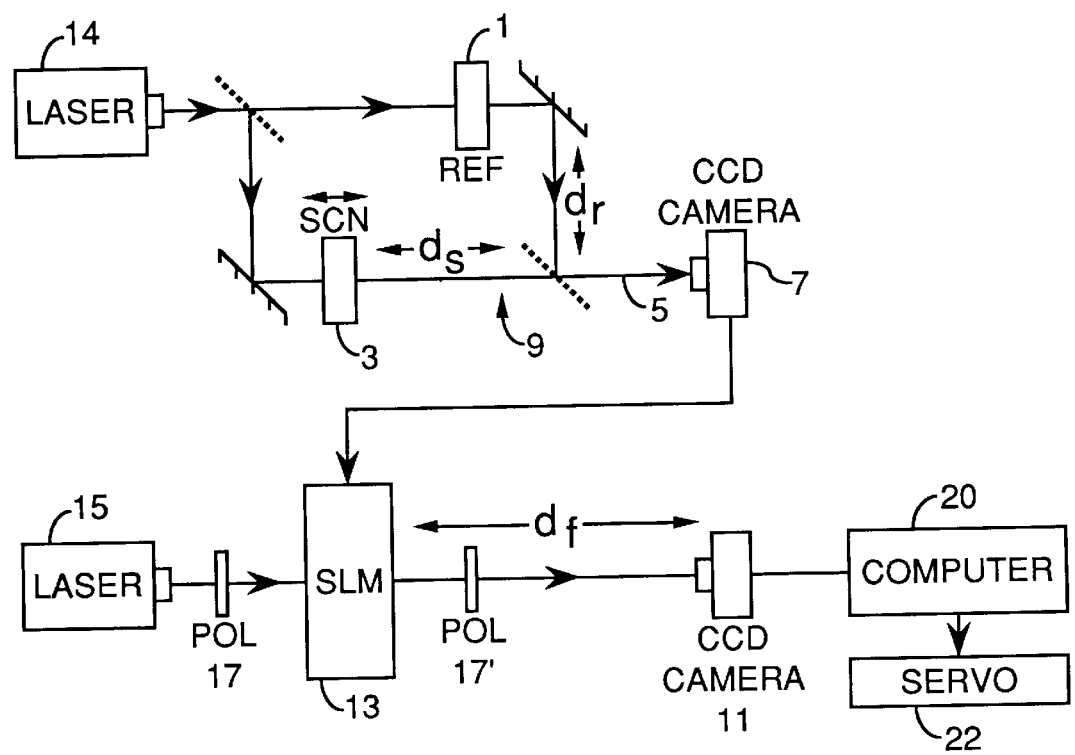
FIG. 2 illustrates a preferred embodiment of the invention.

The output at camera 11 is formed by illuminating the zone plate formed on the transform plane at SLM 13 with a plane wave from laser 15 as is illustrated in FIG. 2. The output plane is the zone plate's focal plane. A correlation peak is formed in the output plane at the point directly behind the center of the zone plate. This output stage can be identical to the output stage of the single-lens JTC of the aforesaid patent. Assuming a linear OASLM, the output signal formed at the transform plane has uniform phase and the intensity pattern given by Eq. 2. This can be separated as the superposition of two spherical wavefronts and a plane wavefront. The output peak is formed by the spherical wave which converges to a point in the output plane. A second wavefront diverges from a point $z_{out}$ in front of the OASLM 7, and forms noise in the output plane. The plane wave is the result of the DC average of the light passing through the amplitude encoded zone plate, and is also a noise signal.

$$I(x, y) = \left| \frac{-j\pi d^2}{2\lambda(z_{in} + \Delta z)} \exp\left(\frac{2j\pi(z_{in} + \Delta z)}{\lambda}\right) \exp\left[\frac{j\pi(x^2 + y^2)}{\lambda(z_{in} + \Delta z)}\right] \frac{J_1\left[\pi d\sqrt{x^2 + y^2}/\lambda(z_{in} + \Delta z)\right]}{\pi d\sqrt{x^2 + y^2}/\lambda(z_{in} + \Delta z)} + \right.$$

$$\left. \frac{-j\pi d^2}{2\lambda z_{in}} \exp\left(\frac{2j\pi z_{in}}{\lambda}\right) \exp\left\{\frac{j\pi[(x - x_o)^2 + y^2]}{\lambda z_{in}}\right\} \frac{J_1\left(\pi d\sqrt{(x - x_o)^2 + y^2}/\lambda z_{in}\right)}{\pi d\sqrt{(x - x_o)^2 + y^2}/\lambda z_{in}} \right|^2 \approx$$

$$\left(\frac{\pi d^2}{2\lambda z_{in}}\right)^2 \left| \exp\left(\frac{2j\pi \Delta z}{\lambda}\right) \exp\left[\frac{j\pi(x^2 + y^2)}{\lambda(z_{in} + \Delta z)}\right] + \exp\left\{\frac{j\pi[(x - x_o)^2 + y^2]}{\lambda z_{in}}\right\} \right|^2 = \left(\frac{\pi d^2}{2\lambda z_{in}}\right)^2 \left[2 + 2\cos\left(\frac{\pi}{\lambda z_{in}} \frac{\Delta z}{(z_{in} + \Delta z)} \left\{\left[x - \left(\frac{z_{in}}{\Delta z} + 1\right)x_o\right]^2 + y^2 - \theta\right\}\right)\right] \tag{2}$$

$$\text{where } \theta = \left(\frac{z_{in}}{\Delta z} + 1\right)^2 x_o{}^\square - \left(\frac{z_{in}}{\Delta z} + 1\right)^2 x_o + 2z_{in}(z_{in} + \Delta z).$$

patterns produced by the two pinholes:

Since only the center of the Airy pattern is in the active region of the SLM, it is modeled as having uniform value of one across the region. This is a reasonable approximation and can be approached with arbitrary accuracy by reducing the size of the pinholes or by lengthening the input distance, $z_{in}$. The approximation $z_{in} \approx z_{in} + \Delta z$ is made where this quantity appears in an amplitude term, but is not made where phase is important. The final form of Eq. 2 is easily As with the single-lens JTC, the peak height, the peak width, and the peak-to-noise ratio can all be estimated for a diffraction limited output. For a linear zone plate, one half of the output energy is in the DC term (the plane wave), and one fourth of the energy is in each of the two spherical waves. It is noteworthy that this is the same as the intensity distribution between the autocorrelation and cross-correlation peaks for a JTC with identical inputs. The output region is an area the same size as the transform plane SLM output, and is in the Fresnel diffraction region of this waveform. The noise energy reaching this area includes all of the energy in the DC term and one fourth of the energy in the diverging wave, or 9/16 of the OASLM output energy. One fourth of the output energy is in the correlation peak. The remainder of the output energy is scattered outside the valid detection region. The peak-to-noise ratio is estimated by finding the ratio of the peak energy density in the signal to the average noise energy density. If the aperture of the OASLM is a square with side of length 1 and is illuminated by a laser source of wavelength $\lambda_o$ and intensity $I_o$, the diffraction limited output peak at the location $(Mx_o,0,z_o)$ is given by a sinc$^2$ function with an approximate half width $(x_h)$ of equation (6)

$$x_h = \frac{\lambda_o z_o}{l} \quad (6)$$

$$O_{pk} = \frac{I_o l^4}{4(\lambda_o z_o)^2}. \quad (7)$$

$$PNR_o = \frac{4}{9} \frac{l^4}{(\lambda_o z_o)^2}. \quad (8)$$

and approximate peak intensity, $O_{pk}$ indicated by equation (7).

This yields a diffraction limited peak-to-noise (PNR) estimate of equation (8). Since the input signal from the two pinholes is very clean, the output PNR is very high, and the output is a narrow, easily detected peak.

Regarding transform plane binarization and higher order output peaks, the extension to a binary OASLM is identical to the treatment used for the binary chirp-encoded JTC or single-lens JTC. There is an immediate advantage to be gained if a binary phase modulated OASLM is used rather than a linear device. The largest term in the output noise resulted from the average DC response in the output, which can be eliminated by using an SLM which produces a binary phase modulated output. The binarization process can also be used to obtain higher order diffraction peaks. A binary Fresnel zone plate has a primary focal length equal to the focal length of the linear zone plate and a series of additional foci closer to the zone plate. While each of these shorter, higher order foci contain less energy than the primary focus, the diffraction limited size of the higher order foci are smaller, and the peak intensity is the same. This gains advantages of a shorter optical path and higher resolution. When the optimum threshold is used to binarize the joint spectrum, this nulls the DC average, and the transform plane $$E(x, y) = \sum_{v=0}^{\infty} H_v \cos\left(\frac{2\pi v}{\lambda z_o}\left\{\left[x - \left(\frac{z_{in}}{\Delta z} + 1\right)x_o\right]^2 + y^2 - \theta\right\}\right), \quad (9)$$

where $H_v$ is given by $$H_v = \begin{cases} 0 & \text{for } v \text{ even} \\ \frac{4}{\pi v}(-1)^{(v-1)/2} & \text{for } v \text{ odd} \end{cases} \quad (9)$$

amplitude is proportional to the series expression given by equation (9) where v is an integer. The phase factor q is the same as in Eq. 2, and does not impact the output intensity. Each term in the binary Fresnel zone plate defined by series in Eq. 9 can be viewed as a $$f_v = \frac{z_{in}}{v}\left(\frac{z_{in}}{\Delta z} + 1\right) = \frac{f_o}{v}, \quad (10)$$

zero mean linear Fresnel zone. This produces a series of focal lengths given by equation (10) where v is an odd integer. These higher order correlation peaks occur at the same x-y location as the first order peak, which is the position of the center of the zone plate. The magnification factor is the same for all of the orders. The higher order peaks contain less energy, by a factor of $1/v^2$. They are also narrower by a factor of $1/v$ in both the x and y direction. Thus for a diffraction limited peak, the peak height for the first order peak and higher order peaks is the same. In practice, the assumption that the peaks are diffraction limited only holds for the first few orders. The estimation of the achievable peak-to-noise ratio is similar to the linear case. Assuming the optimum threshold and a phase modulated OASLM, there is no DC term in the transform plane output. Half of the energy is in the real peaks which form output peaks, and half in the virtual peaks which give rise to expanding spherical waves. However, less than one fourth of the virtual peak energy reaches the output region, with the rest of the energy diffracted outside of the valid target region of the output plane. The total noise contribution of these virtual peaks is approximately 11.6% of the SLM output energy. The real output peaks which focus in output planes other than the one being investigated are more of a problem, since all of this energy falls in the valid output region. The OASLM output energy associated with the real output peak for each $$E_v = E_o \frac{4}{\pi^2 v^2}. \quad (11)$$

order is given by equation (11), where $E_o$ is the total OASLM output energy. The signal energy in the first, third, and fifth order peaks are 40.5, 4.5, and 1.6 percent of the total OASLM output. The total energy in all higher than fifth order peaks totals to roughly 3 percent of the OASLM output. Thus for a first, third, and fifth order peak, the portion of the OASLM output contributing to noise is roughly 21, 57, and 60 percent. A good estimate for the noise contribution to any higher than fifth order peak is 61 percent of the OASLM output. The peak intensity for all diffraction limited peaks is the same $$O_{pk} = 0.405 \frac{I_o l^4}{(\lambda_o z_o)^2}. \quad (12)$$

as for the first order peak, and is given by equation 12.

$$PNR_v = \frac{0.405}{E_v} \frac{l^4}{(\lambda_o z_o)^2} \quad (13)$$

where $$E_v = \begin{cases} .21 & v = 1 \\ .57 & v = 3 \\ .60 & v = 5 \\ .61 & v = 7 \text{ or more.} \end{cases}$$

The best attainable peak-to-noise can be estimated by equation (13). For all orders the diffraction limited PNR performance is better than the PNR for a similar linear SLM based system. The reason for this is that binary phase modulation has been assumed and the DC noise term has been eliminated. In practice, diffraction limited performance is difficult to attain beyond the fifth order.

The lensless JTC of the present invention was demonstrated on the experimental apparatus shown in FIG. 2. The inputs were both five micron pinholes illuminated with an argon ion laser 14. The inputs were placed in the arms of the Mach-Zehnder interferometer 9, and were aligned so that both were centered on the optical axis 5. An apertured member including pinhole 3 in the lower path was mounted on a New Focus x-y fiber alignment stage with picomotor drivers. This allowed (uncalibrated) position resolution on the order of 20 nm. The actual position was measured using the adjustment knob of the fiber alignment stage as a micrometer. This allowed positioning in 3.175 micron steps with 0.4 micron measurement accuracy. The output was captured with a Sony XC-7500 CCD monochrome video camera 7. The pixels have a 9.9 micron pitch with a 1:1 aspect ratio. A Sony TKIF-7500 VGA adapter was used to convert the signal directly to a VGA drive signal, and this was used to display the joint power spectrum on a Kopin Corporation LVGA 640×480 active matrix twisted nematic liquid crystal SLM 13. The size of the display area of this SLM is 15.4×11.5 mm, and the pixel pitch is 24 microns with a 1:1 aspect ratio. This resulted in a magnification of 2.2 as a result of the size difference from the camera pixels to the SLM pixels. The SLM was illuminated with a 633 nm He-Ne laser 15. The output was captured using a DVC Company DVC-10A CCD camera 11 and a "Mu-tech" MV-1000 frame grabber 20.

The distance from the upper reference pinhole in the interferometer arm at 1, shown in FIG. 2, to the camera was 160 mm and the distance from the lower scene pinhole, in the second interferometer arm at 3, to the camera was 200 mm. When the size difference between the camera and SLM pixels is included, the output magnification is 12.0. The Fresnel zone is contained within the central disk of the Airy pattern formed by the pinholes. The right side of the image was slightly darker than the center, showing the roll-off at the edge of the Airy disk. The distance between the pinholes and the camera was chosen near 180 mm because at this distance the central lobe of the Airy pattern formed by the Fraunhaufer diffraction pattern of the five micron pinholes completely illuminated the CCD array.

The output was captured for the third, fifth, seventh, ninth, and eleventh order peaks for the output Fresnel zone plate. These peaks were measured at distances of 1.76, 1.10, 0.79, 0.63, and 0.50 m. These measurements correspond to equivalent first order focal lengths of 5.28, 5.50, 5.53, 5.67, and 5.50 m. Surface plots of these peaks showed output peaks of the third, fifth, seventh, ninth and eleventh orders respectively. As expected, the width of the peaks is narrower for the fifth order than the third. For the higher orders, the peak broadens due to non-diffraction limited behavior of the system. Beyond the fifth order, where diffraction limited performance was not seen, the intensity of the peaks fell off, giving rise to much poorer PNR performance. The correlation peak widths are compared in the table of FIG. 3. The peak widths observed with this system are slightly better than twice the diffraction limited width.

Figures 3, 4:
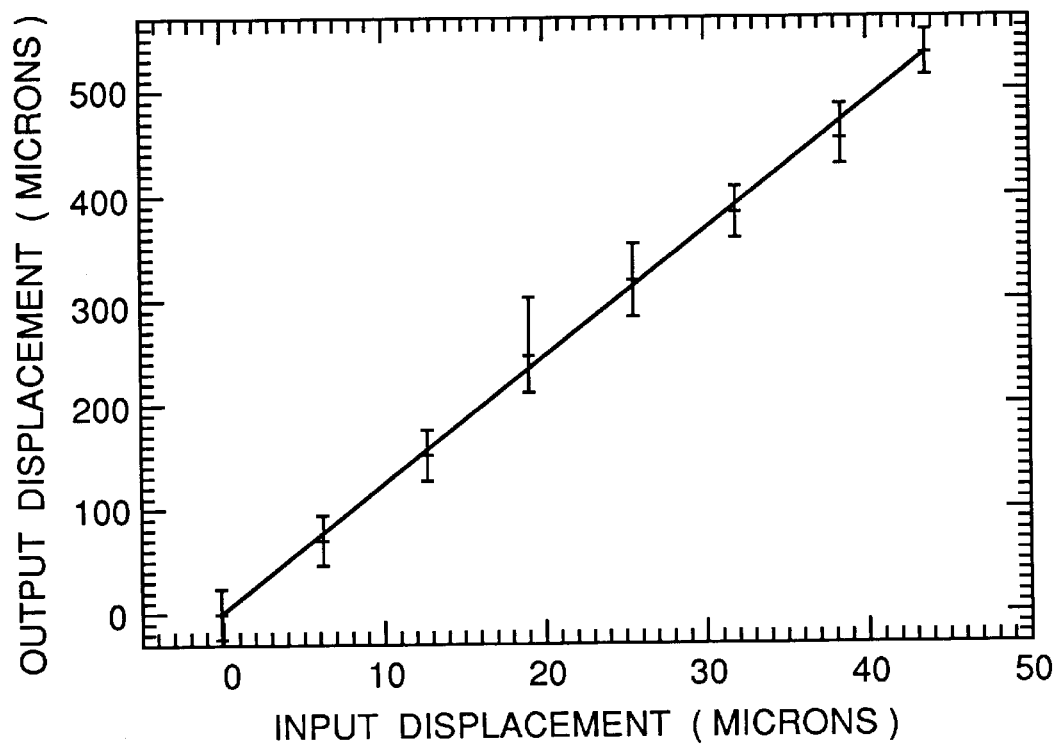
FIG. 3 is a table illustrating an aspect of the invention.
FIG. 4 illustrates the relationship between the input displacement of the pinhole and the displacement of the output correlation peak in microns.

The output peak location change for a movement of the input is shown in FIG. 4. The uncertainty in the input position measurement is ±0.4 microns. The uncertainties shown on the graph show the output position uncertainty based on the half power points of the output peak. The graph shows data taken using the fifth order peak. The optically measured peak location was always within two output pixels (17 m) of the mechanically measured position, indicating a tracking accuracy of about 1.4 m as measured at the input. The PNR for this peak was measured to be 106 dB. The peak shape and peak amplitude remained constant as the input moved. This was not true for the seventh through eleventh orders. These peaks were lower in amplitude, noisier, and both the maximum intensity and the peak shape varied as the peak moved.

In sum, the correlator of the present invention accurately correlates the relative x-y location of two pinholes. The system is similar to the single-lens ITC, but uses Fraunhaufer diffraction rather than a lens to form the transform plane signal. The use of higher order output peaks, a technique which improves the resolution of both the lensless and single-lens JTCs, has been demonstrated. Resolution improves with order as long as diffraction limited performance is achieved. In this experiment, the fifth order was found to produce the best output peak resolution. Three micron shifts of the input pinhole position were observed with an output measurement resolution on the order of one micron. The output signals measured for this system were very clean. For the third and fifth order peaks the peak-to-noise ratio for the correlation measurements were 110 and 106 dB. This demonstrates a potential for very high resolution position determination with potential for use in precision manufacturing and alignment processes. As is obvious to skilled workers in the art, computer 20 could produce a control signal to be fed to servo means 22 to drive the member carrying the scene pinhole an appropriate distance for final precision positioning of this member.

While preferred embodiments have been described, the scope of the invention is intended to cover variations which will occur to the skilled workers in the art and thus the scope of the invention is to be limited solely by the terms of the following claims and art recognized equivalents thereof. For example, the term "pinhole" is intended to include various small light transmissive, or reflective members such as mirrors and the like.

I claim:

1. A joint transform correlator comprising:
   (a) optical transform means for producing an interference pattern between transforms of a first pinhole image and a second pinhole image in a transform plane and which includes joint image positioning means for positioning said first pinhole image a first optical distance from said transform means and for positioning said second pinhole image a second optical distance from said transform means different from said first optical distance for producing a joint power spectrum signal at said transform plane, which signal includes an encoded lens signal; and
   (b) output detector means positioned in a focal plane of said encoded lens signal for producing an output signal indicative of the relative displacement between said first and second pinhole images.

2. The correlator of claim 1 wherein said output detector means produces an output correlation peak signal having a position within said focal plane indicative of the degree of separation between said first and second pinhole images.

3. The joint transform correlator of claim 1 wherein said encoded lens signal includes a representation of at least a portion of a Fresnel zone plate.

4. The joint transform correlator of claim 2 wherein said encoded lens signal includes a representation of at least a portion of a Fresnel zone plate.

5. A joint transform correlator for measuring displacement between a pair of fiducials comprising:

(a) optical transform means for producing an interference pattern between transforms of a first pinhole fiducial and a second pinhole fiducial, laterally separated from said first pinhole fiducial, in a transform plane and which includes joint image positioning means for positioning said first pinhole fiducial a first optical distance from said transform means and for positioning said second pinhole fiducial a second optical distance from said transform means, different from said first optical distance, for producing a joint power spectrum signal at said transform plane which signal includes an encoded lens signal; and (b) output detector means positioned in a focal plane of said encoded lens signal for producing an output correlation peak signal indicative of the relative displacement between said first and second pinhole fiducials.

6. The correlator of claim 5 wherein said output detector means produces an output correlation peak signal having a position within said focal plane indicative of the magnified degree of separation between said first and second pinhole images.

7. The joint transform correlator of claim 5 wherein said encoded lens signal includes a representation of at least a portion of a Fresnel zone plate.

8. The joint transform correlator of claim 6 wherein said encoded lens signal includes a representation of at least a portion of a Fresnel zone plate.

9. A joint transform correlator for measuring displacement between a pair of fiducials comprising:

(a) lensless optical transform means for producing an interference pattern between transforms of a first pinhole fiducial and a second pinhole fiducial, laterally separated from said first pinhole fiducial, in a transform plane and which includes joint image positioning means for positioning said first pinhole fiducial a first optical distance from said transform means and for positioning said second pinhole fiducial a second optical distance from said transform means, different from said first optical distance, for producing a joint power spectrum signal at said transform plane which signal includes an encoded lens signal; and (b) output detector means positioned in a focal plane of said encoded lens signal for producing an output correlation peak signal indicative of the relative displacement between said first and second pinhole fiducials.

10. The correlator of claim 9 wherein said output detector means produces an output correlation peak signal having a position within said focal plane indicative of the magnified degree of separation between said first and second pinhole images.

11. The joint transform correlator of claim 9 wherein said encoded lens signal includes a representation of at least a portion of a Fresnel zone plate.

12. The joint transform correlator of claim 10 wherein said encoded lens signal includes a representation of at least a portion of a Fresnel zone plate.

13. A joint transform correlator comprising:

(a) optical transform means for producing an interference pattern between transforms of a first pinhole image and a second pinhole image in a transform plane and which includes joint image position measurement means for determining the relative displacement of said first pinhole image a first optical distance from said transform means and said second pinhole image a second optical distance from said transform means different from said first optical distance by producing a joint diffraction image at said transform plane, which signal includes an encoded lens signal comprised of a representation of at least a portion of a Fresnel zone plate; and (b) transform plane detector means positioned in an image plane of said encoded lens signal for producing an output signal indicative of the relative displacement between said first and second pinhole images.

14. The correlator of claim 13 wherein said transform plane detector means produces an image of said encoded lens signal and light from said image produces an output signal which is detected in a focal plane of said lens signal, producing an output correlation peak signal having a position within said focal plane indicative of the degree of separation between said first and second pinhole images.

15. The joint transform correlator of claim 13 wherein said encoded lens signal is binarized.

16. The joint transform correlator of claim 14 wherein said encoded lens signal is binarized.

17. The joint transform correlator of claim 16 wherein said focal plane is nearer to the said encoded lens signal than the primary focus of said Fresnel zone plate.

18. A joint transform correlator for measuring displacement between a pair of fiducials comprising:

(a) optical transform means for producing an interference pattern between transforms of a first pinhole fiducial and a second pinhole fiducial, laterally separated from said first pinhole fiducial, in a transform plane, and which includes joint image positioning means for positioning said first pinhole fiducial a first optical distance from said transform plane and for positioning said second pinhole fiducial a second optical distance from said transform plane, different from said first optical distance, for producing a joint diffraction signal at said transform plane which signal includes an encoded lens signal comprised of a representation of at least a portion of a Fresnel zone plate; and (b) transform plane detector means positioned in an image plane of said encoded lens signal for producing an output signal indicative of the relative displacement between said first and second pinhole fiducials.

19. The correlator of claim 18 wherein said transform plane detector means produces an image of said encoded lens signal and light from said image produces an output signal which is detected in a focal plane of said lens signal, producing an output correlation peak signal having a position within said focal plane indicative of the degree of separation between said first and second pinhole fiducials.

20. The joint transform correlator of claim 18 wherein said encoded lens signal is binarized.

21. The joint transform correlator of claim 19 wherein said encoded lens signal is binarized.

22. The joint transform correlator of claim 18 wherein said image plane is nearer to the said encoded lens signal than the primary focus of said Fresnel zone plate.

* * * * *